(12) United States Patent
Inoue et al.

(10) Patent No.: US 6,320,645 B1
(45) Date of Patent: Nov. 20, 2001

(54) STAGE SYSTEM AND EXPOSURE APPARATUS, AND DEVICE MANUFACTURING METHOD USING THE SAME

(75) Inventors: Mitsuru Inoue; Nobushige Korenaga, both of Utsunomiya; Yukio Tokuda, Kawasaki, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/324,652

(22) Filed: Jun. 3, 1999

(30) Foreign Application Priority Data

Jun. 5, 1998 (JP) .................................... 10-172099

(51) Int. Cl.[7] ........................... G03B 27/42; G03B 27/58; G03B 27/62; G05G 11/00; G05B 1/06
(52) U.S. Cl. ................................ 355/53; 355/72; 355/75; 74/490.09; 318/640
(58) Field of Search ................. 355/53, 43, 75, 355/77, 72; 318/623, 632, 640; 74/490.09, 490.08, 490.13

(56) References Cited

U.S. PATENT DOCUMENTS

| | | | |
|---|---|---|---|
| 4,655,594 | 4/1987 | Wittekoek et al. | 356/363 |
| 5,040,431 | 8/1991 | Sakino et al. | 74/479 |
| 5,050,196 | 9/1991 | Kadosawa et al. | 378/34 |
| 5,228,358 | 7/1993 | Sakino et al. | 74/479 |
| 5,402,680 | 4/1995 | Korenaga | 73/518 |
| 5,467,720 | 11/1995 | Korenaga et al. | 108/20 |
| 5,518,550 | 5/1996 | Korenaga et al. | 118/729 |
| 5,608,773 | 3/1997 | Korenaga et al. | 378/34 |
| 5,681,638 | 10/1997 | Korenaga | 428/119 |
| 5,684,856 | 11/1997 | Itoh et al. | 378/34 |
| 5,685,232 | 11/1997 | Inoue | 108/20 |
| 5,841,250 | 11/1998 | Korenage et al. | 318/135 |
| 5,864,389 | 1/1999 | Osanai et al. | 355/53 |
| 5,909,272 | 6/1999 | Osanai et al. | 355/53 |
| 5,933,215 | 8/1999 | Inoue et al. | 355/53 |
| 5,939,852 | * 8/1999 | Akutsu et al. | 318/623 |
| 5,996,437 | * 12/1999 | Novak et al. | 74/490.09 |

* cited by examiner

Primary Examiner—Russell Adams
Assistant Examiner—Peter B. Kim
(74) Attorney, Agent, or Firm—Fitzpatrick, Cella, Harper & Scinto

(57) ABSTRACT

A stage system includes a movable stage, a guide mechanism for guiding the stage with respect to a predetermined direction, and a preloading mechanism for producing a magnetic attraction force with which the rigidity of the guide mechanism can be increased, wherein a portion to be attracted by the magnetic attraction force is made of a material having a product of a residual magnetic flux density Br and a holding force Hc in a hysteresis curve, not greater than 100 J/m$^3$, this being very effective to reduce the hysteresis force, which is resistance due to the residual magnetic force, as compared with the preloading attraction force, whereby high precision positioning of the stage is accomplished.

13 Claims, 6 Drawing Sheets

STAGE SYSTEM AND EXPOSURE APPARATUS, AND DEVICE MANUFACTURING METHOD USING THE SAME

FIELD OF THE INVENTION AND RELATED ART

This invention relates generally to an exposure apparatus for use in the production of semiconductor devices through printing, by exposure, a design pattern on a resist of a substrate. More particularly, the invention is concerned with a stage system suitably usable in such exposure apparatus. According to another aspect, the invention is directed to an exposure apparatus having such stage system or a device manufacturing method using the same.

As such exposure apparatuses, there are 1) steppers wherein, while moving, a substrate, such as a wafer, stepwise, a pattern of an original is printed on different exposure regions of the substrate, by exposure through a projection optical system, and 2) scan-type exposure apparatuses wherein an original, such as a mask, and a substrate are scanningly moved in synchronism with each other and relative to a projection optical system so that a pattern of the original is printed on the substrate.

In addition thereto, step-and-scan type exposure apparatuses have recently been proposed in an attempt to performing high precision exposure of fine pattern, in which stepwise motion and scanning exposure as described above are repeated so that fine patterns are printed on different regions on a substrate precisely. In this type of exposure apparatus, since only a portion of a projection optical system relatively close to its optical axis is used with restriction by a slit, higher precision and wider picture angle printing of a fine pattern is enabled.

However, in high precision and fine exposure apparatus, such as step-and-scan type exposure apparatus, in order that the performance of a projection optical system is fully utilized to practically improve the exposure precision, the positional registration between an original and a substrate should be further improved.

SUMMARY OF THE INVENTION

It is an object of the present invention to provide a novel concept for improving the positional registration in a stage system usable in an exposure apparatus, for example.

In accordance with an aspect of the present invention, there is provided a stage system, comprising: a movable stage; a guide mechanism for guiding the stage with respect to a predetermined direction; and a preloading mechanism for producing a magnetic attraction force with which the rigidity of the guide mechanism can be increased; wherein a portion to be attracted by the magnetic attraction force is made of a material having a product of residual magnetic flux density Br and holding force Hc in a hysteresis curve, not greater than 100 J/m$^3$.

In one preferred form of this aspect of the present invention, the guide mechanism has a guiding surface including a portion to be attracted by the magnetic attraction force, and a gas or air bearing disposed between the guiding surface and the stage.

The preloading mechanism may include a magnet provided on the stage side.

The portion to be attracted by the magnetic attraction force may contain one of (i) Ni-Fe alloy containing permalloy and including 30 or more weight percent Ni, (ii) Si-Fe alloy including 1 or more weight percent Si, and (iii) pure iron.

The stage may be supported on a guiding surface of a stage base.

The stage may be made movable two-dimensionally along a guiding surface.

The stage may include a first stage supported by a guiding surface of a stage base and being movable in a first direction, and a second stage supported by a guiding surface of the stage base and being movable in a second direction relative to the first stage, wherein at least the second stage may be provided with a preloading mechanism.

The stage may be guided by a yawing guide with respect to a yawing direction in which the stage is to be moved.

The stage may be provided with a preloading mechanism for applying a preloading force between it and the yawing guide.

The stage system may include a linear motor for moving the stage.

In accordance with another aspect of the present invention, there is provided an exposure apparatus, comprising: an exposure system for performing an exposure process to a substrate to be exposed; and a stage system including (i) a movable stage, (ii) a guide mechanism for guiding the stage with respect to a predetermined direction, and (iii) a preloading mechanism for producing a magnetic attraction force with which the rigidity of the guide mechanism can be increased; wherein a portion to be attracted by the magnetic attraction force is made of a material having a product of residual magnetic flux density Br and a holding force Hc in hysteresis curve, not greater than 100 J/m$^3$.

In one preferred form of this aspect of the present invention, the scanning exposure is performed while moving the substrate with the stage.

The exposure may be performed in accordance with a step-and-scan method.

In accordance with a further aspect of the present invention, there is provided a device manufacturing method, comprising the steps of: preparing an exposure apparatus as recited above; and performing an exposure process to a substrate by use of the exposure apparatus.

In one preferred form of this aspect of the present invention, the method further comprises applying a photosensitive material to the substrate, and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
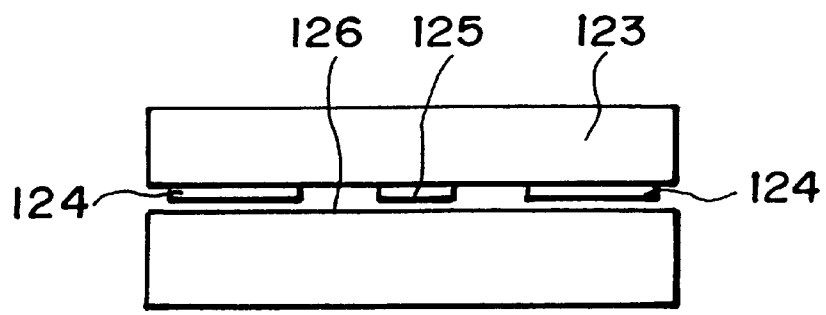
FIG. 1 is a schematic view for explaining the concept of a stage system according to an embodiment of the present invention.

In a preferred embodiment of the present invention, as illustrated in FIG. 1, a guide mechanism includes a guiding surface 126 having a portion to be attracted by magnetic attraction force, and gas or air bearings 124 disposed between the guiding surface and a stage 123. Preloading force applying mechanism includes a magnet 125 fixedly mounted on the stage 123 for producing magnetic attraction force to attract the portion of the guiding surface 126.

As regards the material of the portion to be attracted, preferably it consists of (i) Ni—Fe alloy containing permalloy and including 30 or more weight percent Ni, (ii) Si—Fe alloy including 1 or more weight percent Si, or (iii) pure iron. With this structure, the force by hysteresis (resistance force due to residual magnetic force) which functions between it and the portion to be attracted by magnetic attraction, whose position being sequentially shifted, becomes not greater than $\frac{1}{1000}$ of the attraction force of preloading. Thus, high precision positioning of the stage is accomplished.

In regard to the material of the portion to be attracted, a material having a good machinability (easy machining) is preferable because the guiding surface should have flatness to be accomplished with high precision machining, from the viewpoint of the function as a guiding mechanism.

Figure 2:
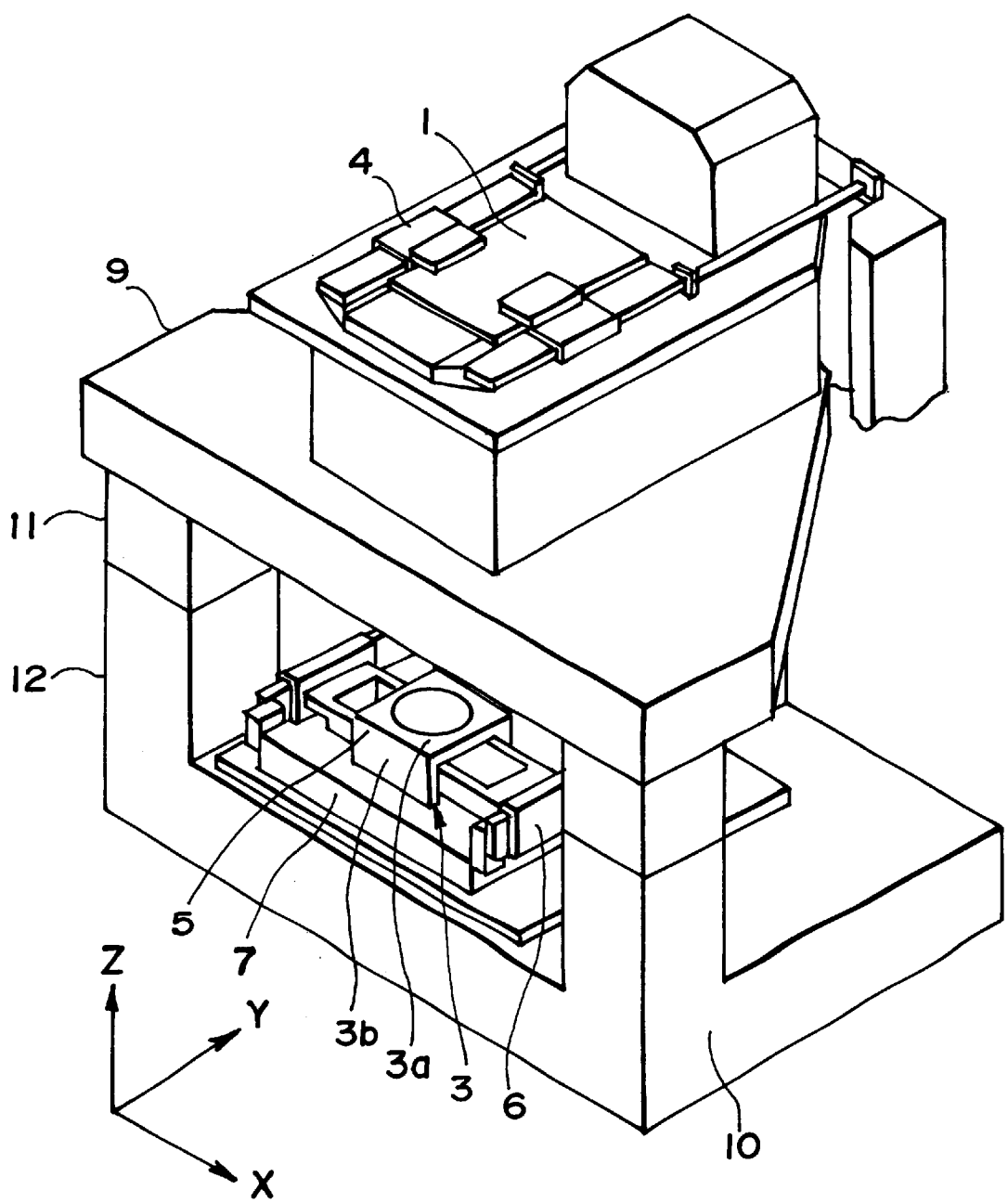
FIG. 2 is a schematic view of an exposure apparatus according to an embodiment of the present invention.

A preferred embodiment of the present invention will be described in conjunction with the drawings. FIG. 2 schematically illustrates an exposure apparatus according to an embodiment of the present invention. This exposure apparatus is a step-and-scan type exposure apparatus in which a portion of a pattern of an original held by a reticle stage 1 is projected on a wafer (substrate to be exposed) held by a fin-motion stage (not shown) mounted on an X-Y stage, through a projection optical system (not shown). The reticle and the wafer are moved in the Y direction in synchronism with each other, relative to the projection optical system, by which the pattern of the reticle is printed on the wafer. Such scanning exposure process is repeated to plural regions on the wafer, with stepwise motion of the wafer intervening.

The reticle stage 1 can be moved in the Y direction by means of a linear motor 4. The X–Y stage 3 includes an X stage 3a, which is driven in the X direction by a linear motor 5, and a Y stage 3b, which is driven in the Y direction by another linear motor 6. Synchronous scan of the reticle and the wafer is performed by moving the reticle stage 1 and the Y stage 3b in the Y direction at a predetermined speed ratio (e.g., 4:1). Stepwise motion of the wafer in the X direction is made by means of the X stage 3a.

The X–Y stage 3 is movable two-dimensionally along the guiding surface of the stage base 7. The stage base 7 is supported on the floor, for example, through dampers. While details of the X–Y stage will be described later, there is a fine-motion stage (not shown) which is mounted on the X stage 3a. This fine-motion stage is operable to move the wafer relative to the X stage 3, in the tilt direction and the rotational direction about the Z axis.

The reticle stage 1 and the projection optical system are supported by a barrel base 9. The barrel base 9 is supported by a base frame 10 through three dampers 11 and pillars 12.

Figure 3:
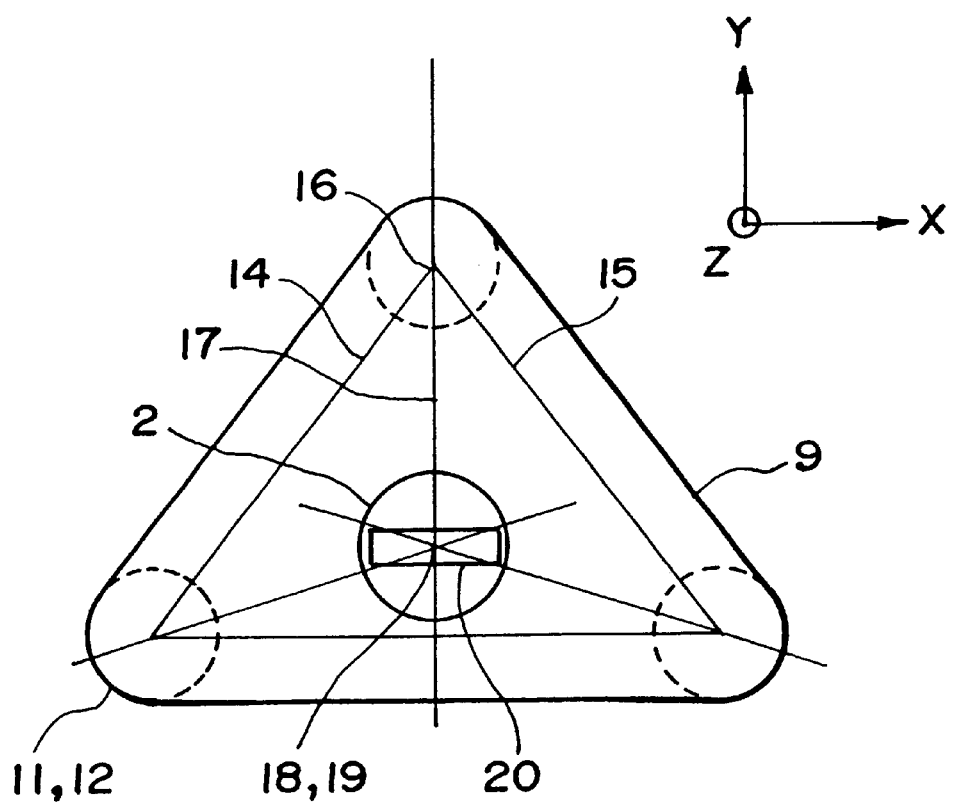
FIG. 3 is a schematic view for explaining the positional relation among dampers or pillars, the scan direction in scanning exposure, the projection optical system, and the exposure light, in the apparatus of FIG. 2 and as viewed from the above of the apparatus.

FIG. 3 illustrates the positional relation among the dampers 11 or pillars 12, the scan direction in scanning exposure operation, the projection optical system 2 and the exposure light, as viewed from the above of the exposure apparatus. As shown in the drawing, there are three supporting points for the barrel support 9 by the dampers 11 and pillars 12 which define an isosceles triangle shape. The scan direction Y is parallel to a straight line 17 which connects the intersection 16 of the two equilaterals 14 and 15 and the gravity center of the isosceles triangle, and also the gravity center 18 thereof and the gravity center 19 of the projection optical system 2 are substantially coincident with each other. Denoted at 20 in the drawing is the cross-section of exposure light, formed into a slit-like shape. The lengthwise direction of the slit-like shape lies in a direction (X direction) perpendicular to the scan direction. Two of the three dampers 11 are disposed in the front portion of the apparatus, while the remaining one is disposed in the rear portion of the apparatus. The wafer conveyance path is defined from the front of the apparatus, and between the two pillars 12 disposed in the front portion.

Figure 4:
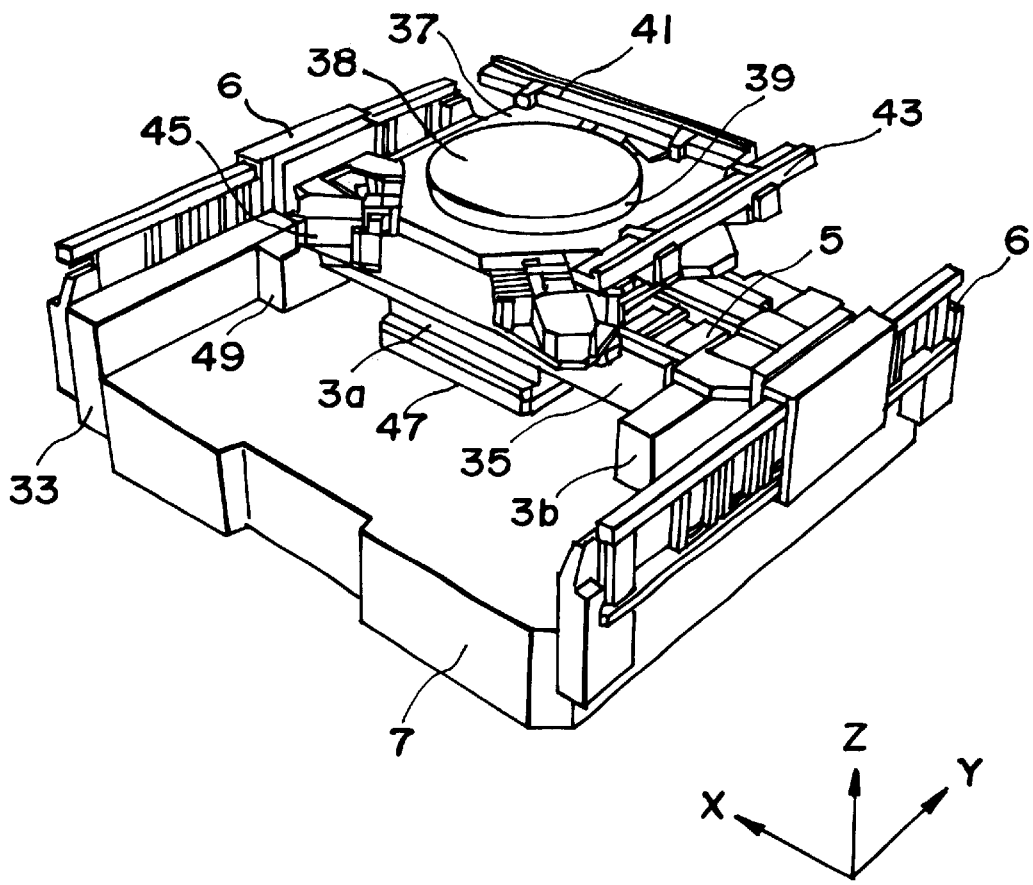
FIG. 4 is a perspective view of an X-Y stage of the apparatus of FIG. 2.

FIG. 4 is a perspective view for explaining details of the X-Y stage 3. As shown in the drawing, there is a guiding surface formed on the stage base 7. The Y stage 3b is mounted thereon via the linear motor 6, movably in Y direction. Denoted at 33 is a Y-direction yawing guide fixedly mounted on the stage base 7. It serves to guide the Y stage 3b with respect to the yawing direction in Y direction.

Figure 5:
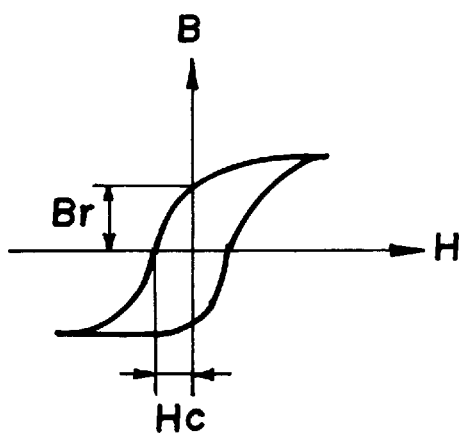
FIG. 5 is a graph for explaining the residual magnetic flux density Br and the holding force Hc, in a hysteresis curve.

At a side face of the Y stage 3b opposed to the yaw guide, there are air pads (not shown) constituting gas or air bearing means between the side faces of the yaw guide 33 and of the Y stage 3b. Also, as has been described with reference to the conceptual illustration of FIG. 1, at the side face of the Y stage 3b, there is a magnet for applying a preloading force based on magnetic attraction force, for improving the rigidity in guiding by the side face of the yaw guide 33. The magnet is disposed to be sandwiched by pads of the air bearing. At least the guiding face of the surface of the yaw guide 33 is made of a material which can be attracted by this magnet. More specifically, a material having a product of residual magnetic flux density Br and holding force Hc in hysteresis curve (see FIG. 5), not greater than 100 $J/m^3$, is used. For example, it contains Ni—Fe alloy containing permalloy and including 30 or more weight percent Ni, Si—Fe alloy including 1 or more weight percent Si, or pure iron.

Denoted at 35 is an X-direction yawing guide mounted on the side face of the Y stage 3b. The X-direction yaw guide serves to guide the X stage 3a, mounted on the Y stage 3b through the linear motor 5, with respect to the yawing direction of X direction. Denoted at 37 is a fine-motion stage which is mounted on the X stage 3a, and denoted at 39 is a wafer chuck which is mounted on the fine-motion stage 37 and for holding a wafer 38. Denoted at 41 and 43 are a mirror for Y-direction position measurement and a mirror for X-direction position measurement, which are fixedly mounted on the fine-motion stage 37. Denoted at 45 is an actuator for moving the fine-motion stage 37 relatively to the X stage 3a. Denoted at 47 are air pads which are provided at the bottom face of the X stage 3a, opposed to the guiding face of the stage base 7, and which constitute air bearing means between the top surface of the stage base 7 and the bottom face of the X stage 3a. Denoted at 49 are air pads disposed on the bottom of the Y stage 3b, opposed to the guiding surface of the stage base 7, and which constitute air bearing means between the top surface of the stage base 7 and the bottom face of the Y stage 3b.

Also, as has been described with reference to the conceptual illustration of FIG. 1, at the bottom faces of the X stage 3a and Y stage 3b, there are magnets for applying a preloading force based on magnetic attraction force, for improving the rigidity in guiding by the top face of the stage base 7. The magnets are disposed to be sandwiched by pads of the air bearing. At least the guiding face of the surface of the stage base 7 is made of a material which can be attracted by this magnet. More specifically, a material having a product of residual magnetic flux density Br and holding force Hc in hysteresis curve (see FIG. 5), not greater than 100 J/m$^3$, is used. For example, it contains Ni—Fe alloy containing permalloy and including 30 or more weight percent Ni, Si—Fe alloy including 1 or more weight percent Si, or pure iron.

In the exposure apparatus of the structure described above, a wafer is introduced and loaded on the X-Y stage 3, through a conveyance path between the two pillars 12 at the front of the apparatus by the wafer conveying means (not shown). Then, a predetermined alignment operation is made to the wafer. Subsequently, the exposure apparatus operates to perform lithographic transfer of the pattern of the reticle onto different exposure regions on the wafer, while repeating the scanning exposure and stepwise motion. For the scanning exposure, the reticle stage 1 and the Y stage 3b are moved in the Y direction (scan direction) at a predetermined speed ratio while the pattern of the reticle is scanned with slit-like exposure light and, on the other hand, the wafer is scanned with a projected thereof. By this procedure, the reticle pattern is printed on a predetermined exposure region on the wafer. When scanning exposure with regard to one exposure region on the wafer is completed, the X stage 3a is moved stepwise in the X direction, and a next exposure region of the wafer is positioned with respect to the scan exposure start position. Then, the scan exposure thereto is made. The disposition of exposure regions on the wafer and the scan direction in the Y direction (positive or negative) as well as the order of exposures of these exposure regions are determined so as to assure efficient exposures of the exposure regions through a combination of wafer stepwise motion in the X direction and wafer scanning exposure movement in the Y direction.

Figure 6:
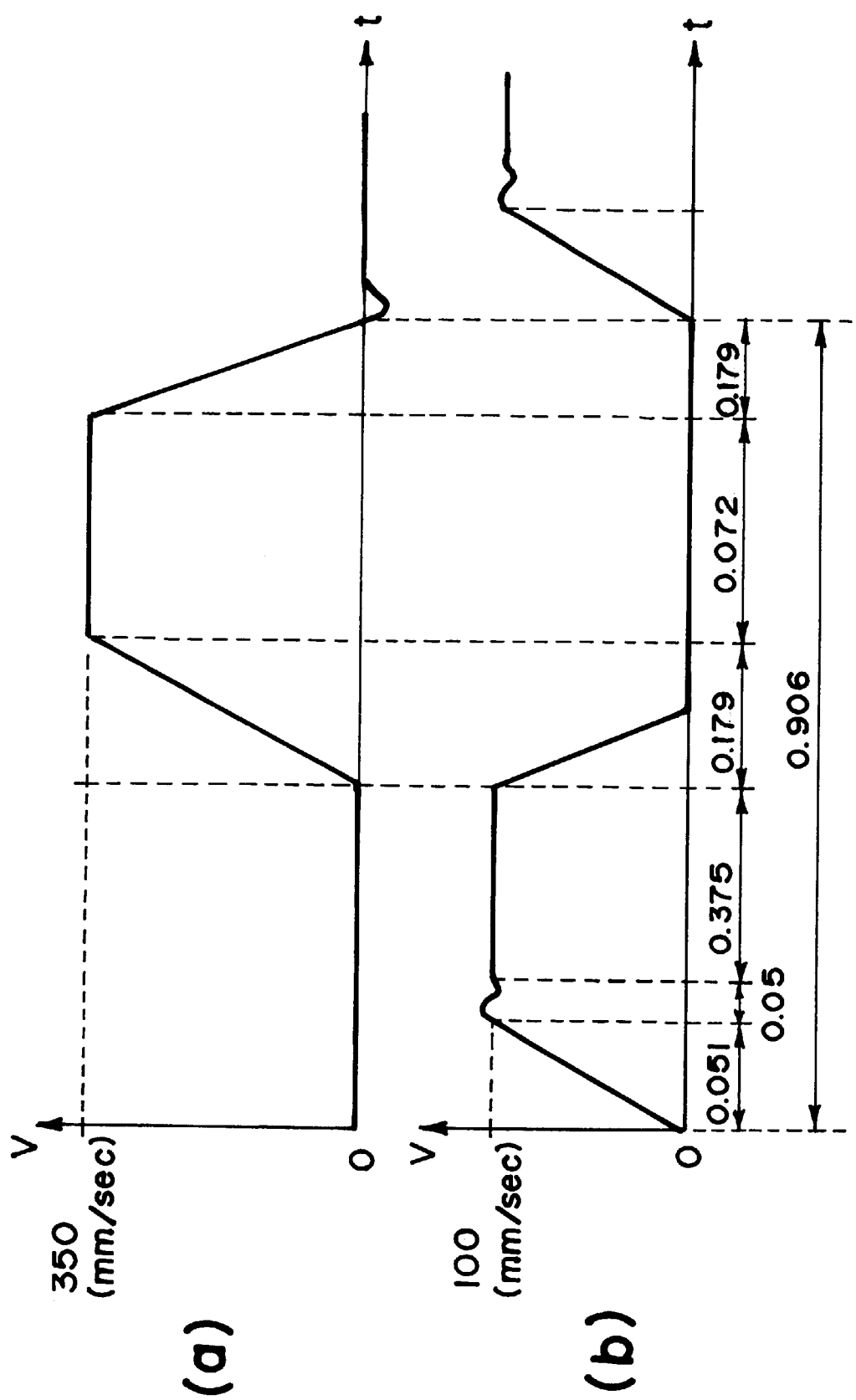
FIG. 6 is a graph for explaining an example of change, with respect to time, of the movement speed of X and Y stages in stepwise motion and scanning exposure operations, in the apparatus of FIG. 2.

FIG. 6 is a graph showing, at (a) and (b), an example of change, with respect to time, of movement speeds of X stage 3a and Y stage 3b in their stepwise motion and scan exposure movement. When acceleration of the Y stage starts, the Y stage moves through an acceleration period of 0.051 sec. and a stabilization period of 0.05 sec. and, after that, it moves at a constant speed 100 mm/sec through a period of 0.375 sec. During this constant speed movement period, the exposure operation is made. After this scanning exposure period, the Y stage is decelerated while, on the other hand, acceleration of the X stage starts and stepwise motion thereof is performed. After the stepwise motion is completed, the acceleration of the Y stage is made again in a similar manner. By repeating the motion of the X and Y stages, the pattern of the reticle is printed sequentially onto plural exposure regions on the wafer by scanning exposure, according to the step-and-scan exposure method.

In accordance with the stage system as described above, a portion of the guide mechanism to be attracted by a magnetic attraction force for applying a preloading force is made of a material having a product of a residual magnetic flux density Br and a holding force Hc in a hysteresis curve, not greater than 100 J/m$^3$. As a result of this, the hysteresis force (resistance force by residual magnetism) acting between it and the portion to be attracted by the magnetic attraction force, whose position is shifted sequentially, can be reduced and, therefore, the positioning precision of the stage can be improved significantly.

The material may contain one of (i) Ni—Fe alloy containing permalloy and including 30 or more weight percent Ni, (ii) Si—Fe alloy including 1 or more weight percent Si, and (iii) pure iron. This is effective to make the force due to hysteresis not greater than $\frac{1}{1000}$ of the attraction force for the preloading. Further improvement of positioning precision can be accomplished thereby.

When exposure is made by using an exposure apparatus having such a stage system, good positional registration between an original and a substrate is maintained, and high precision exposure is accomplished. Particularly, in scan exposure, since the exposure is made while scanningly moving a stage, enhancement of stage precision is directly reflected to the exposure transfer precision. Thus, the present invention provides significant advantages.

Next, an embodiment of a device manufacturing method which uses an exposure apparatus such as described above, will be explained.

Figure 7:
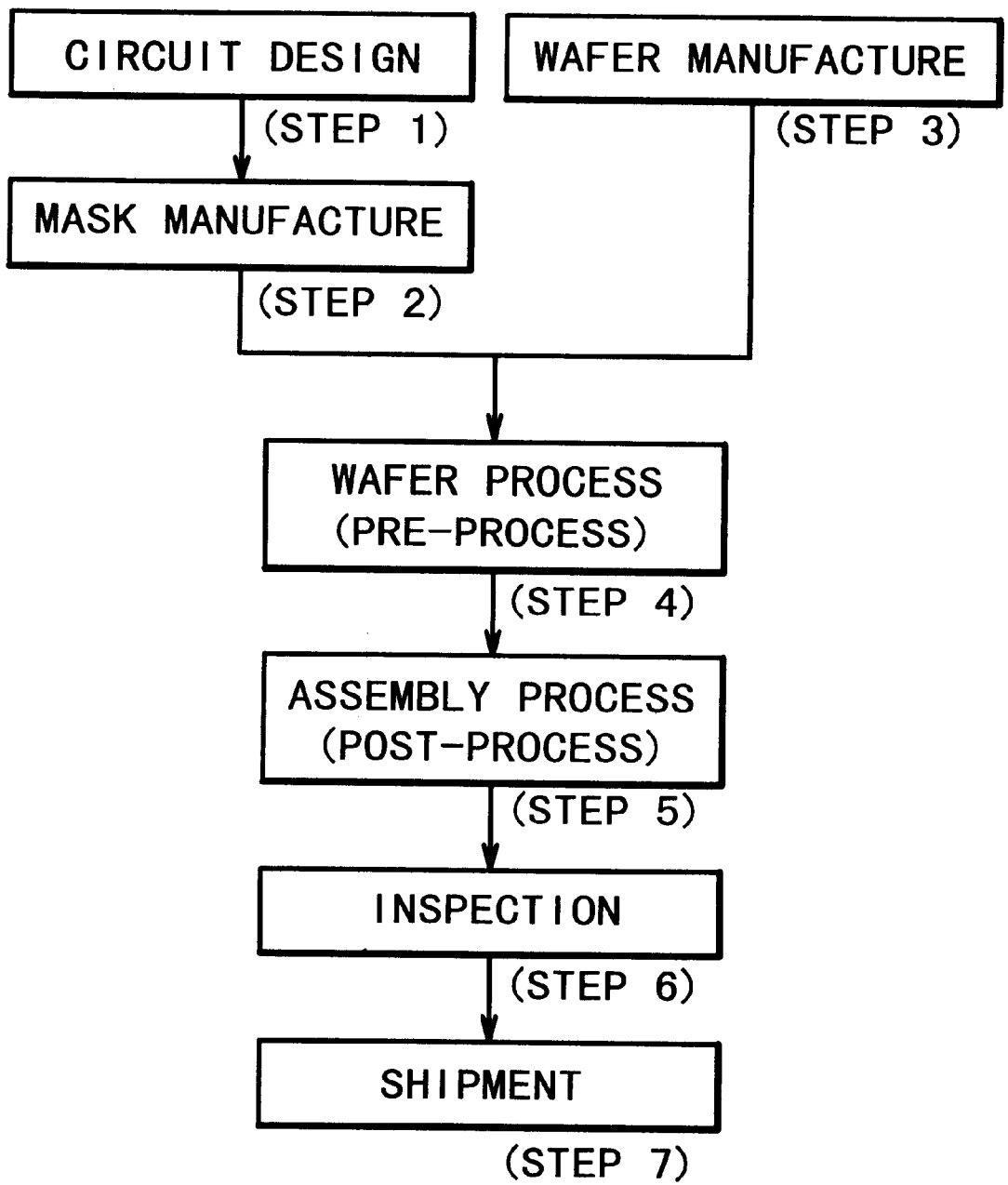
FIG. 7 is a flow chart for explaining device manufacturing processes.

FIG. 7 is a flow chart of procedure for manufacture of microdevices such as semiconductor chips (e.g. ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes assembling (dicing and bonding) process and packaging (chip sealing) process. Step 6 is an inspection step wherein operation check, durability check and so on for the semiconductor devices provided by step 5, are carried out. With these processes, semiconductor devices are completed and they are shipped (step 7).

Figure 8:
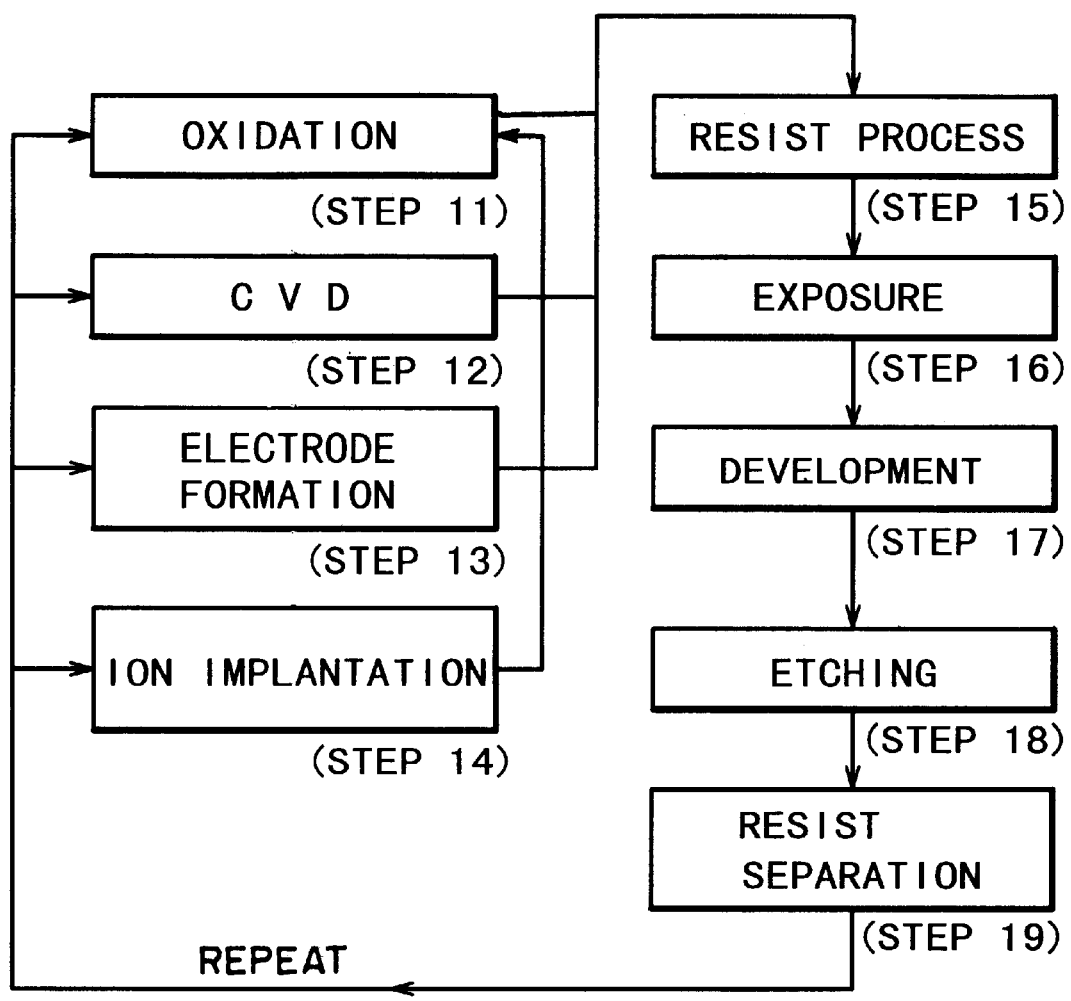
FIG. 8 is a flow chart for explaining a wafer process.

FIG. 8 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A stage system, comprising:

a movable stage;

a stage base having a guiding surface for supporting said movable stage thereon;

a gas bearing disposed between said guiding surface and said movable stage; and a preloading mechanism for producing a magnetic attraction force between said guiding surface and said movable stage;

wherein at least said guiding surface of said stage base is made of a material having a product of a residual magnetic flux density Br and a holding force Hc in a hysteresis curve, not greater than 100 $J/m^3$.

2. A stage system according to claim 1, wherein said preloading mechanism includes a magnet provided on the stage side.

3. A stage system according to claim 1, wherein at least said guiding surface of said stage base contains one of (i) Ni—Fe alloy containing permalloy and including 30 or more weight percent Ni, (ii) Si—Fe alloy including 1 or more weight percent Si, and (iii) pure iron.

4. A stage system according to claim 1, wherein said stage is movable two-dimensionally along said guiding surface.

5. A stage system according to claim 1, wherein said stage includes a first stage supported by said guiding surface of said stage base and being movable in a first direction, and a second stage supported by said guiding surface of said stage base and being movable in a second direction relative to said first stage, wherein at least said second stage is provided with a preloading mechanism.

6. A stage system according to claim 1, wherein said stage is guided by a yawing guide with respect to a yawing direction in which said stage is to be moved.

7. A stage system according to claim 6, wherein said stage is provided with a preloading mechanism for applying a preloading force between it and the yawing guide.

8. A stage system according to claim 1, further comprising a linear motor for driving said stage.

9. An exposure apparatus, comprising:

an exposure system for performing an exposure process to a substrate to be exposed; and a stage system including (i) a movable stage, (ii) a stage base having a guiding surface for supporting said movable stage thereon, (iii) a gas bearing disposed between said guiding surface and said movable stage, and (iv) a preloading mechanism for producing a magnetic attraction force between said guiding surface and said movable stage;

wherein at least said guiding surface of said stage base is made of a material having a product of a residual magnetic flux density Br and a holding force Hc in a hysteresis curve, not greater than 100 $J/m^3$.

10. An apparatus according to claim 9, wherein scanning exposure is performed while moving the substrate with said stage.

11. An apparatus according to claim 9, wherein exposure is performed in accordance with a step-and-scan method.

12. A device manufacturing method, comprising the steps of:

preparing an exposure apparatus comprising: an exposure system for performing an exposure process to a substrate to be exposed; and a stage system including (i) a movable stage, (ii) a stage base having a guiding surface for supporting said movable stage thereon, (iii) a gas bearing disposed between said guiding surface and said movable stage, and (iv) a preloading mechanism for producing a magnetic attraction force between said guiding surface and said movable stage, wherein at least said guiding surface of said stage base is made of a material having a product of a residual magnetic flux density Br and a holding force Hc in a hysteresis curve, not greater than 100 $J/m^3$; and performing an exposure process to a substrate by use of the exposure apparatus.

13. A method according to claim 12, further comprising applying a photosensitive material to the substrate, and developing the exposed substrate.

* * * * *

UNITED STATES PATENT AND TRADEMARK OFFICE
CERTIFICATE OF CORRECTION

PATENT NO. : 6,320,645 B1
DATED : November 20, 2001
INVENTOR(S) : Mitsuru Inoue et al.

It is certified that error appears in the above-identified patent and that said Letters Patent is hereby corrected as shown below:

<u>Column 1,</u>
Line 25, "perform-" should read -- perform --.
Line 26, "ing" should be deleted.

Signed and Sealed this

Twenty-eighth Day of May, 2002

*Attest:*

JAMES E. ROGAN
*Attesting Officer*   *Director of the United States Patent and Trademark Office*